United States Patent [19]

Ferro

[11] 4,053,922
[45] Oct. 11, 1977

[54] LIGHT TRIGGERED THYRISTOR HAVING CONTROLLED TURN ON DELAY

[75] Inventor: Armand P. Ferro, Schenectady, N.Y.

[73] Assignee: General Electric Company, Schenectady, N.Y.

[21] Appl. No.: 687,986

[22] Filed: May 19, 1976

[51] Int. Cl.² .............................................. H01L 29/74
[52] U.S. Cl. ........................................ 357/38; 357/4; 357/30; 357/51; 357/86
[58] Field of Search ................... 357/30, 38, 51, 4, 86

[56] References Cited

U.S. PATENT DOCUMENTS

| 3,719,863 | 3/1973 | Ogawa et al. | 357/38 |
| 3,893,153 | 7/1975 | Page et al. | 357/38 |
| 3,914,783 | 10/1975 | Terasawa | 357/38 |
| 3,922,708 | 11/1975 | Crowder et al. | 357/51 |
| 3,930,304 | 1/1976 | Keller et al. | 357/51 |
| 3,969,752 | 7/1976 | Martin et al. | 357/51 |
| 3,990,092 | 11/1976 | Yoshimura | 357/51 |
| 4,012,761 | 3/1977 | Ferro et al. | 357/30 |

Primary Examiner—Stanley D. Miller, Jr.
Assistant Examiner—Joseph E. Clawson, Jr.
Attorney, Agent, or Firm—Stephen B. Salai; Joseph T. Cohen; Jerome C. Squillaro

[57] ABSTRACT

A light triggered thyristor is provided including an electrode surrounding a gate area which is sensitive to radiation impinging thereon to turn on the device. Trimable resistor means are connected between said electrode and the cathode of the device to allow adjustment of the turn-on time of the device to compensate for processing tolerances during the manufacture of the device.

11 Claims, 8 Drawing Figures

LIGHT TRIGGERED THYRISTOR HAVING CONTROLLED TURN ON DELAY

This invention relates in general to thyristor devices and more particularly to light triggered thyristors having integral resistor means for controlling the turn-on characteristics of the thyristor.

It is often times desirable to utilize multiple thyristors in either series or parallel circuit relationship in order to achieve higher voltage and/or current capability than would be realizable utilizing a single device. The turn-on characteristics of thyristors are known to vary from device-to-device due to tolerances attendant the processes utilized in the manufacture of the devices. Accordingly, it is necessary when utilizing multiple devices which are intended to be simultaneously triggered, to provide means for modifying the turn-on times of the individual devices to, as closely as possible, match them. The turn-on of thyristor devices varies with the magnitude of voltage applied to the gate terminals thereof. The turn-on delay, that is the time between the application of a gate signal and the turn-on of the high current carrying portion of the device, varies with the gate voltage applied and also from device-to-device. As the gate turn-on signal is increased in magnitude, the turn-on delay decreases. The extent to which the gate turn-on signal may be increased in magnitude is limited both by the device and by other considerations such as the size and, therefore, cost of the turn-on signal source. It is, of course, desirable to provide turn-on with as small a gate source as possible consistent with achieving satisfactory turn-on characteristics. Insofar as turn-on delay times increase with decreasing magnitude turn-on signals, it is especially important to provide closely matched turn-on times for multiple device systems.

Special problems are involved in multiple light fired thyristor systems insofar as the nature of the gate turn-on signal is a light signal rather than an electrical signal. Typically, light fired thyristors do not include a gate terminal and adjustment of the turn-on signal applied to the device in order to accommodate varying device characteristics is often times difficult to achieve. As light fired thyristor devices become more widely used especially in high voltage, high current applications, the matching of these devices in order to achieve substantially simultaneous turn-on likewise increases in importance.

It is an object of this invention to provide a light fired thyristor device including means for adjusting the turn-on delay of the device.

It is another object of this invention to provide a light fired thyristor including integrally formed resistor means for modifying the turn-on delay time of the device.

It is a further object of this invention to provide a light fired thyristor device including resistively modified turn-on delay time means which are easily adjustable in order to match the turn-on delay times of multiple devices for use in series or parallel arrangement.

Briefly stated and in accordance with one presently preferred aspect of this invention, a radiation triggered thyristor includes an electrode substantially surrounding a light sensitive gate region of the device, and trimable resistor means connected between said electrode and the cathode of the device for selectively adjusting the turn-on delay time of the device. In accordance with one specific embodiment of the invention the resistor means comprise laser trimable metal resistor means, while in accordance with another embodiment of the invention, semiconductor resistor means are utilized either alone or in combination with chip resistor means or metal film resistor means. This invention is readily applicable to both plane and planar semiconductor structures and while it is usefully employed with devices having a wide range of operating characteristics, it is most usefully employed in conjunction with high voltage devices of the type generally utilized in high voltage direct current switching applications.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1A:
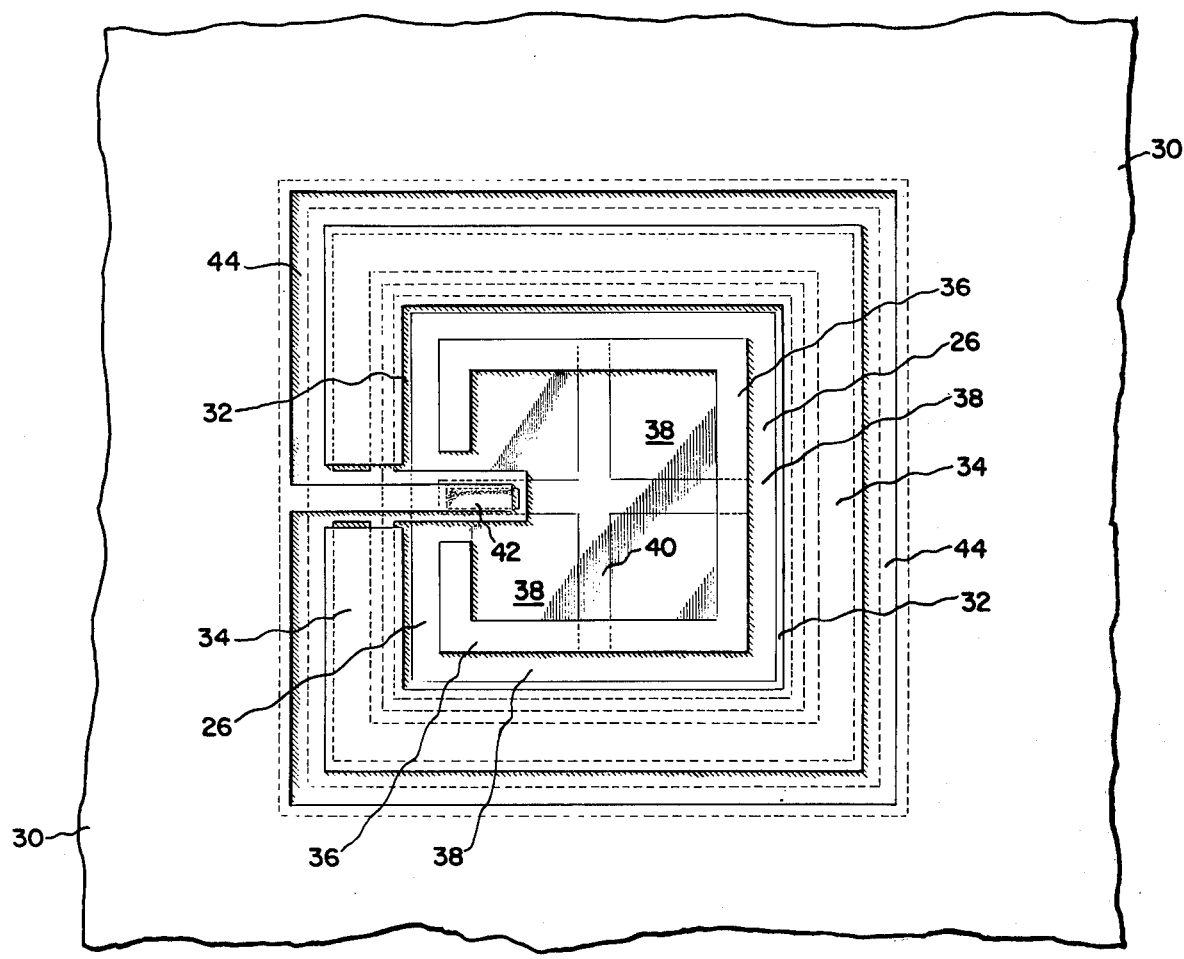
FIG. 1 illustrates a monolithic thyristor structure utilizing a semiconductor resistor in accordance with one aspect of this invention.
Figure 1B:
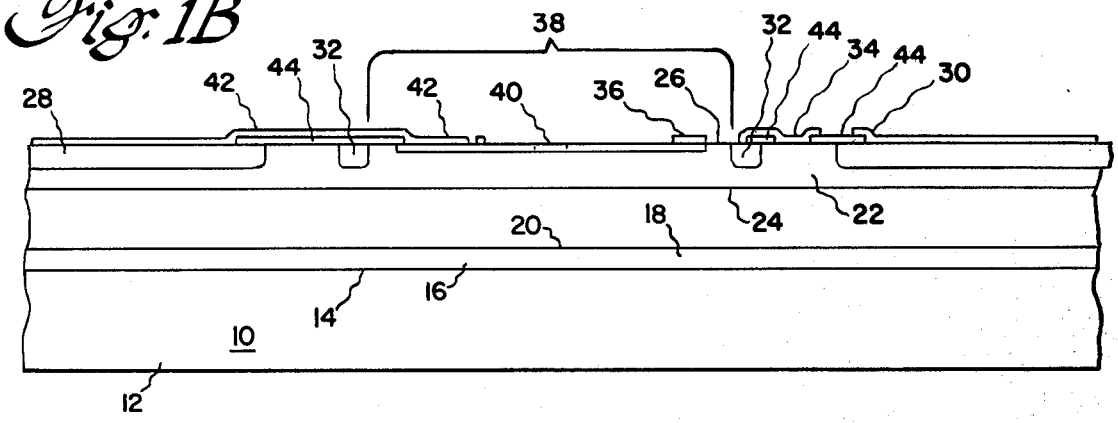

The device of FIG. 1 is of the monolithic type often utilized in the medium current and voltage ranges. FIG. 1 illustrates a four-layer device having an electrically conductive electrode 10 having a first contact surface 12 and a second surface 14. First semiconductor layer 16 overlies electrode 10 and is joined thereto at surface 14. Semiconductor layer 16 may conveniently be of silicon or other semiconductor material well known to those skilled in the art. Semiconductor layer 16 may further be of either p or n-conductivity type semiconductor material, p-type being more common and therefore utilized in the illustration of this invention shown in FIG. 1. As is well known, thyristor devices are conventionally formed in four layers of alternating p and n-type conductivity semiconductor material. While the device of FIG. 1 is a pnpn device, it will be understood that the invention as herein described applies equally well to variations of four-layer devices such as triacs, and to other light triggered or activated devices. Second semiconductor layer 18 overlies layer 16 and is of opposite conductivity type. A first semiconductor junction 20 is formed between layers 16 and 18. A third semiconductor layer 22 overlies layer 18 and is of opposite conductivity type as layer 18. A second semiconductor junction 24 is formed between layers 22 and 18. Layers 16 and 22 are typically formed by diffusion into an n-conductivity type wafer having surfaces 26 and 14. Semiconductor layer 22 includes surface 26 which is opposite junction 24. A first semiconductor region 28 extends from surface 26 of semiconductor layer 22 down into layer 22 towards, but not meeting, junction 24. Semiconductor region 28 is of opposite conductivity type as layer 22 and forms the main emitter of the device. Semiconductor region 28 may also be variously formed as is well known to those skilled in the art, as for example, by diffusion. It will be appreciated by reference to FIG. 1 that only the central portion of a device in accordance with this invention is shown and described herein. Various methods are known for the design of the edges of thyristor devices, as for example, beveling, either positive or negative, moat etches and others. It will be appreciated that this invention may be applied equally well to a device including any of these edge treatments and therefore only the central portions of the device including the inner portion of the main emitter is shown. Semiconductor region 28 along with metallization 30 comprise the main emitter and contact therefor of the device. Although shown in a generally square geometry it will be appreciated that other geometries may readily be employed if desired. Within main emitter 28 second semiconductor region 32 extends from surface 26 of semiconductor layer 22 down towards, but not meeting semiconductor junction 24. Semiconductor region 32 is also of opposite conductivity type semiconductor material as layer 22 and form, along with metallization 34 the pilot emitter of the device. Electrode 36 which is located within the pilot thyristor region of the device surrounds light sensitive gate area 38. The operation of light triggered thyristor devices is by now well known to those skilled in the art. Accordingly, extensive discussion of the mechanisms involved in light firing will not be included herein. Light will be understood to impinge upon the device in the light sensitive area and to penetrate therethrough to semiconductor junction 24 and the depletion region adjacent thereto to form hole-electron pairs near the junction. Current flows from electrode 12 towards light sensitive gate region 38 and then laterally in layer 22 beneath the pilot thyristor region including region 32 and electrode 34 towards the main emitter which includes semiconductor region 28 and electrode 30. As will be appreciated, current flowing laterally beneath the auxiliary semiconductor will cause that region of the device to turn on which in turn will increase the current flow through the device in the gate region associated with the main thyristor section thereby causing the main emitter to turn on.

In accordance with this invention, at least part of the current flowing in the device due to radiation impinging upon the gate area is collected by electrode 36 which is connected at three points to a resistor comprising semiconductor layer 40. Semiconductor layer 40 is arranged in a generally X shaped configuration, one leg of which is connected to metallization 42 which is an extension of electrode 30, the emitter electrode of the device. Electrode 42 is insulated from the device except where in comes in contact with resistive layer 40, by oxide layer 44. Oxide layer 44 also provides for the isolation of metallization 34 from semiconductor region 32 at the outside edge thereof and also insulates the inside edge of electrode 30 from semiconductor layer 22. The combination of electrode 36, resistive layer 40 and electrode 42 comprise a resistor in parallel with the resistor comprising semiconductor layer 22 extending laterally from the light sensitive gate region beneath the pilot thyristor and towards the main thyristor region of the device. The ratio of the resistances of the path followed by current generated in the light sensitive gate area and the resistance of the combination of electrode 36, resistive layer 40 and electrode 42 determine the ratio of currents flowing in the two paths. It will be appreciated that only the current flowing in semiconductor layer 22 will tend to turn on the device of FIG. 1. The current which is carried by electrode 36, resistive layer 40 and electrode 42 tends to shunt some of the current generated by light impinging on light sensitive gate area 38 directly to the emitter of the device thereby reducing the turn-on threshold of the device for a given incident light intensity. The device of FIG. 1 is readily adapted to be finely adjusted to select a particular turn-on delay time characteristic. It will be appreciated that the resistance between electrode 36 and electrode 30 will be determined almost entirely by the resistance of semiconductor layer 40. Semiconductor layer 40 is illustrated in FIG. 1 as a region extending from surface 26 of semiconductor layer 22 down towards, but not meeting, junction 24. Semiconductor layer 40 may conveniently be formed at the same time as layer 28 during a diffusion or other process. The depth of semiconductor layer 40 will determine the resistivitity thereof and the diffusion process may be continued for either a longer or shorter time than that which forms regions 32 and 28 in order to provide an appropriate resistance. Further, electrode 42 extends over leg 46 of resistive layer 40 effectively shorting out a portion thereof underlying electrode 42. Electrode 42 may conveniently be trimmed, as for example, by laser trimming methods well known to those skilled in the art to increase the total resistance of the effective portion of resistive layer 40 between electrodes 36 and 42. Accordingly, electrode 46 may be initially formed so as to substantially completely overlying leg 46 and, if desired, portions of the remaining three legs of the resistive layer. The effective resistance between electrodes 36 and 42 may then be changed over a fairly wide range by trimming away portions of electrode 42.

It will be appreciated that electrode 42 itself may be made of a material having a significant resistance thereby providing, in series, a resistive combination which would equal the sum of the resistance due to layer 40 and electr-de 42.

Light sensitive gate area 38 is illustrated in FIG. 1 as being a polished area. This may be desirable in accordance with this invention, but it is to be understood that other conventional methods for preparing light sensitive areas in thyristors may readily be employed in accordance with this invention. For example, light sensitive gate area 38 may be coated with an antireflective passivant as is well known. Additionally, it may be desirable to provide for a somewhat thinner region in semiconductor layer 22 to provide for enhanced illumination of junction 24. Actions of this type are well known and may be employed, if desired, in conjunction with this invention.

Figure 2A:
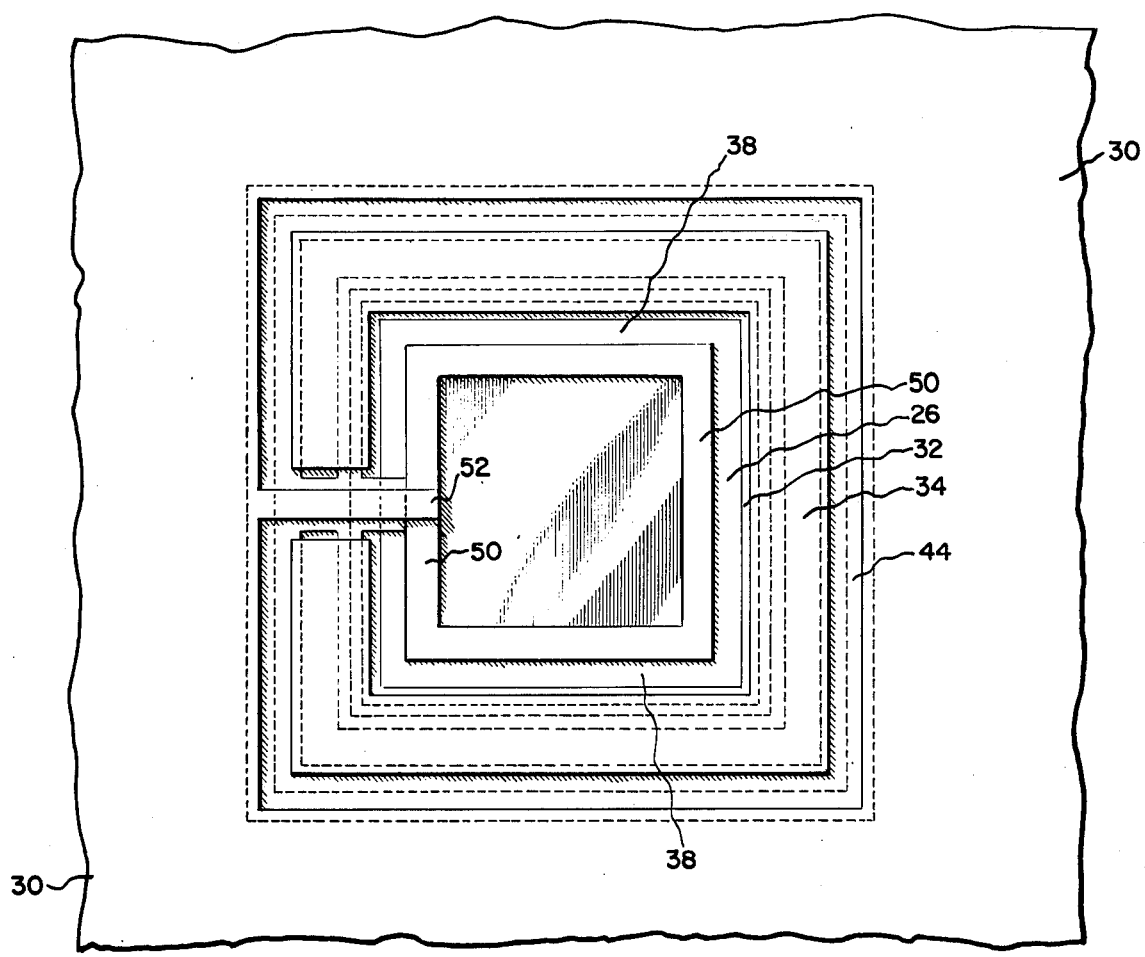
FIG. 2 illustrates a light triggered center gated thyristor structure in accordance with this invention.
Figure 2B:
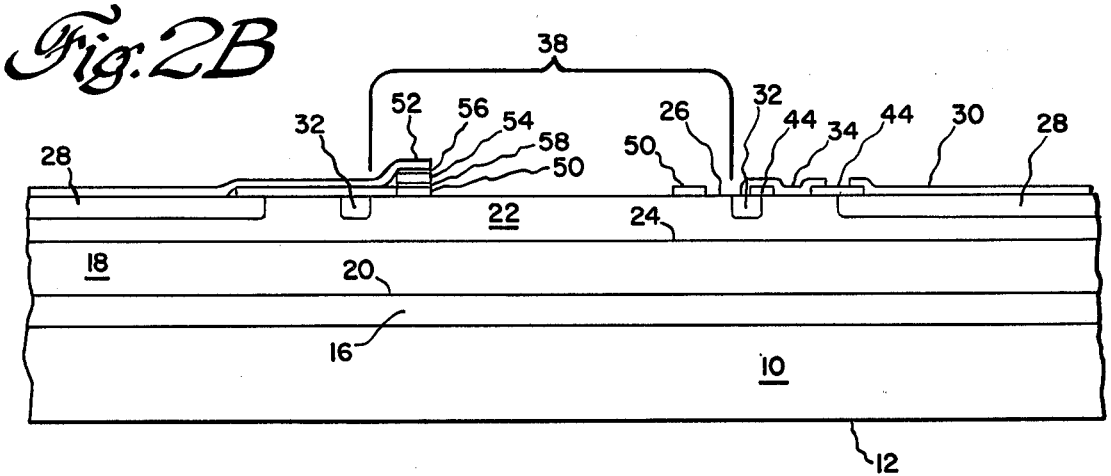

A thyristor in accordance with this invention is illustrated at FIG. 2 wherein resistive layer 40 is replaced by a discrete chip resistor. The structure of FIG. 2 is substantially identical to that of FIG. 1 except for the type of resistor utilized. Accordingly, like reference numerals denote like elements in the figures. Electrode 50 of FIG. 2 corresponds to electrode 36 of FIG. 1. Electrode 50 is a continuous electrode not having the separation therein for the passage of electrode 42 to diffuse resistor 40. Electrode 52 corresponds to electrode 42 of FIG. 1 except that it is shorter. Electrode 52 extends from a metallization 30 and contacts resistor 54 at first contact 56 thereof. Second contact 58 of resistor 54 is connected to electrode 50. It will be seen, therefore, that resistor 54 is connected in series between the two electrodes and performs the same function as resistive layer 40 in the embodiment of this invention illustrated at FIG. 1. Electrode 52 may be either a low resistivity electrode and contribute substantially no resistance between electrode 50 and emitter layer 30, or electrode 52 may be of a suitable material to contribute a substantial fraction of the total resistance between the two electrodes. The resistance of electrode 52 may be varied as is well known by changing the material, the thickness of the electrode, the width, the length and, accordingly, the total resistance may quite readily be adjusted by trimming electrode 52 to precise dimensions to achieve a certain desired resistance. This trimming may be accomplished after fabrication of the device, as for example, by laser cutting of electrode 52 in order to precisely match selected devices insofar as turn-on delay time is concerned.

It will be appreciated, therefore, that the resistance may be roughly established by selection of resistor 54 and more precisely determined by trimming of electrode 52.

Figure 3A:
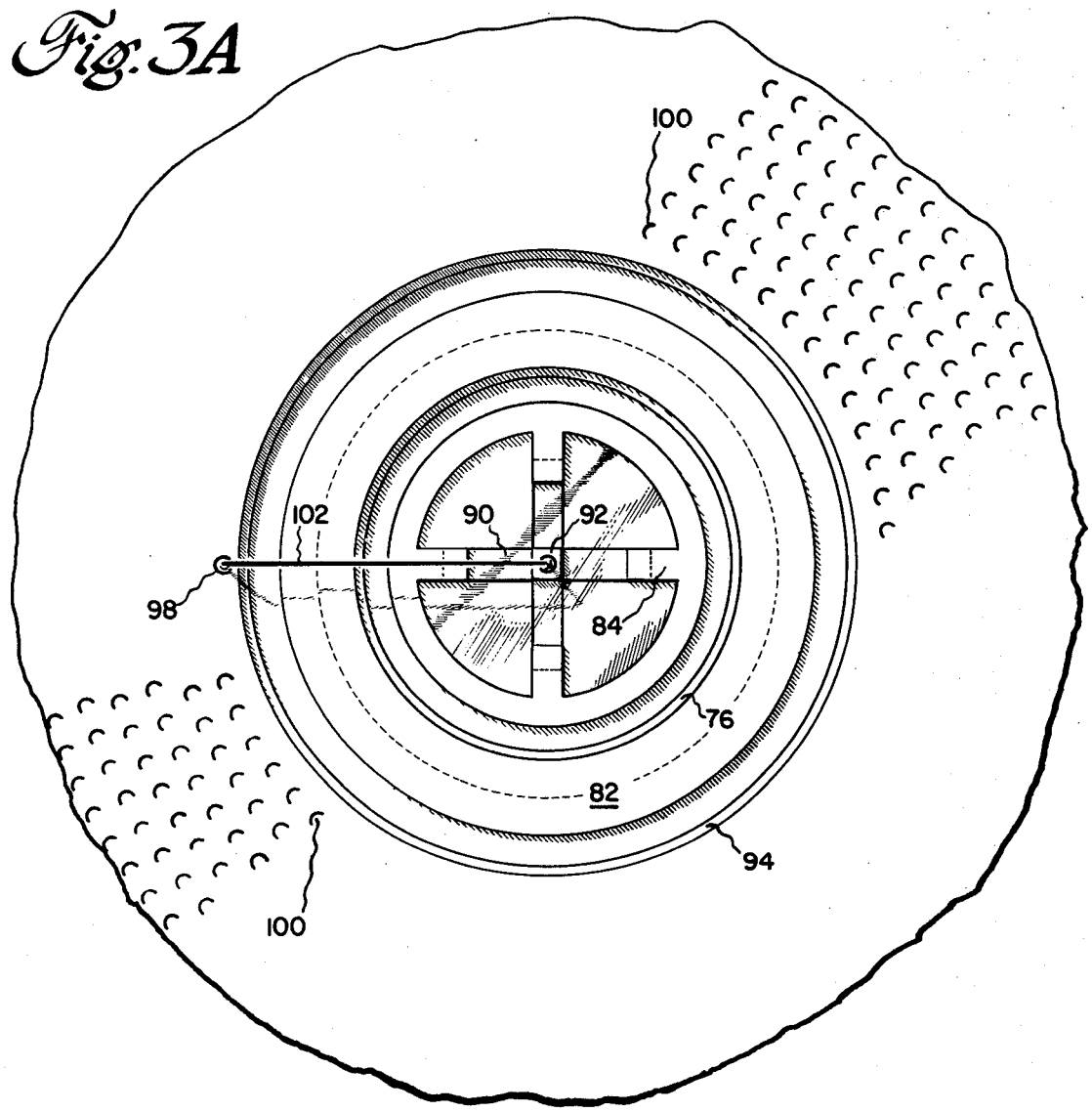
FIG. 3 illustrates a light triggered center gated thyristor structure in accordance with this invention having an alternative resistor arrangement.
Figure 3B:
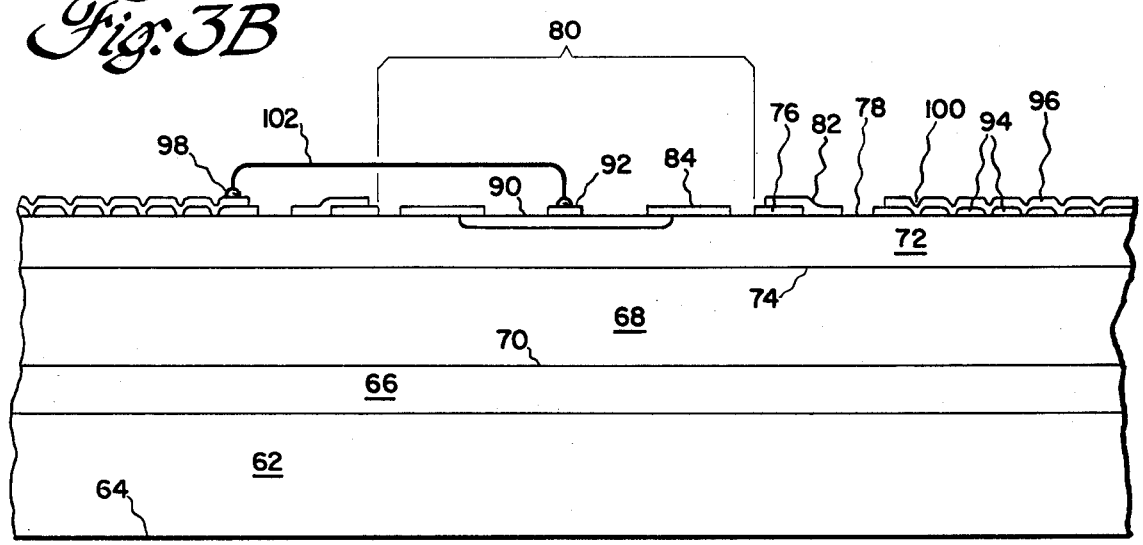

FIG. 3 illustrates a thyristor of generally circular geometry including means for adjusting the turn-on delay time of the device in accordance with another aspect of this invention. The device indicated generally at 60 includes a first metal contact 62 which is the anode contact of the device. Contacts 62 may be provided with a high conductivity coating at surface 64 thereof for improving electrical contact thereto. First semiconductor layer 66 overlies contact 62 and forms a low resistivity connection thereto. Layer 66 is a semiconductor layer, as for example, silicon, germanium or the like of a first conductivity type. In accordance with this invention, semiconductor layer 66 will be assumed to be a p-type semiconductor layer. Device 60 is a pnpn thyristor device, it being understood that the limitations discussed in conjunction with FIG. 1 apply with respect to the ordering of the various semiconductor layers in order to achieve an other devices, if desired. Semiconductor layer 68 overlies layer 66 forming first semiconductor junction 70 therebetween. Semiconductor layer 72 overlies layer 68 forming second semiconductor junction 74 therebetween. Semiconductor layer 68 is an n-conductivity type semiconductor layer while layer 72 is a p-sensitivity type layer. N-conductivity type layer 76 is disposed on surface 78 of p-type layer 72. Layer 76 is of generally annular configuration and surrounds centrally located light sensitive area 80 of the device. Metallization 82 partially overlies layer 76 and contacts surface 78 of semiconductor layer 72 outside of the outermost edge of semiconductor layer 76. The portion of device 60 generally beneath semiconductor layer 76 and metallization 82 is the pilot thyristor region of the device. Device 60 is an amplifying gate thyristor structure of the type generally well known in the art. Light sensitive region 80 includes therein electrode 84 which substantially surrounds the light sensitive region of the device. Electrode 84 includes a plurality of projections 86 through 89 extending inwardly from electrode 84. Resistive layer 90 extends from surface 78 of semiconductor layer 72 down towards but not meeting junction 74. The method through which resistive layer 90 is formed is not critical with respect to this invention, it being possible, for example, to form layer 90 by diffusion. Resistor layer 90 is of generally X-shaped configuration, each arm of the X contacting one of projections 86 through 89. Resistive layer 90 further includes electrical contact 92 in the approximate center thereof which contact is adapted to have electrical connection made thereto.

It will be appreciated that the combination of electrode 84, resistive layer 90 and contact 92 forms an electrical resistor. The magnitude of the resistance of the resistor so formed depends upon the resistivity of layer 90 and the dimensions thereof. In accordance with this invention, projections 86 through 89 are adapted to be adjustable in the extent of their overlap of the resistive layer. For example, each of the projections is initially fabricated extending, in a direction towards contact 92, somewhat further than desired to obtain the appropriate resistance. Trimming of extensions 86 through 89 therefore increases the resistance until an optimum value is reached. This trimming may be accomplished by any methods known to the those skilled in the art, as for example, by laser trimming. The main emitter section of the thyristor of FIG. 3 comprises semiconductor layer 94 of generally annular configuration and electrode 96 which overlies layer 94. Electrode 96 provides the cathode connection of the device and may be provided, in conjunction with semiconductor layer 94, emitter shorts extending through layer 94 and contacting surface 78 of semiconductor layer 72. The use and fabrication of emitter shorts are well known in the art. Electrode 96 is further provided with contacts 98 thereon which is adapted to be connected by convenient means to contact 92. Connection might readily be made, for example, with a wire or by a metal electrode on device 60 insulated therefrom by an oxide layer. Contact 98 need not have any particular physical form and, in fact, may consist of a welded, brazed, pressure or other contact with electrode 96.

The area within electrode 84 may conveniently be polished or otherwise treated to increase its effectiveness as a light sensitive area of the device. Passivation may also be desirable and those skilled in the art will appreciate that passivation with anit-reflective glass may advantageously be employed.

While device 60 includes a direct electrical connection between electrode 98 and electrode 92, which is a low resistance connection, it may be desirable in accordance with this invention to provide some resistance in the physical connection between electrodes 92 and 98. For example, as is well known, nichrome or other wire of substantial resistivity may be employed and by so doing, the requirements for the resistivity of resisitive layer 90 are decreased. The form of resistance between electrode 84 and electrode 98 may be distributed in accordance with this invention in any convenient manner. The use of extensions 86 through 89 as hereinabove described is convenient in order to provide a readily accessible point at which to trim the resistance of the device in order to accurately match two or more devices to provide substantially identical turn-on delay times.

The operation of device 60 is substantially similar to that of FIG. 1. Light impinging on the radiation sensitive gate area 80 of the device causes the formation of hole-electron pairs of the vicinity of junction 74 which pairs migrate radially outward from the center of the device causing current flow beneath the pilot thyristor region of the device which includes semiconductor layer 76 and electrode 82 to the main emitter region of the device and especially to the first row of shorts 100. The resistance which includes resistive layer 90 and connection 102 between electrode 92 and terminal 98 is essentially in parallel with the resistance due to the resistivity of the semiconductor layer 72. Some of the current which would otherwise flow substantially entirely in semiconductor layer 72 is therefore shunted directly to electrode 96 thus causing the desired increase in turn-on delay time which increase may be adjusted by adjusting the resistance in accordance with this invention.

Figure 4A:
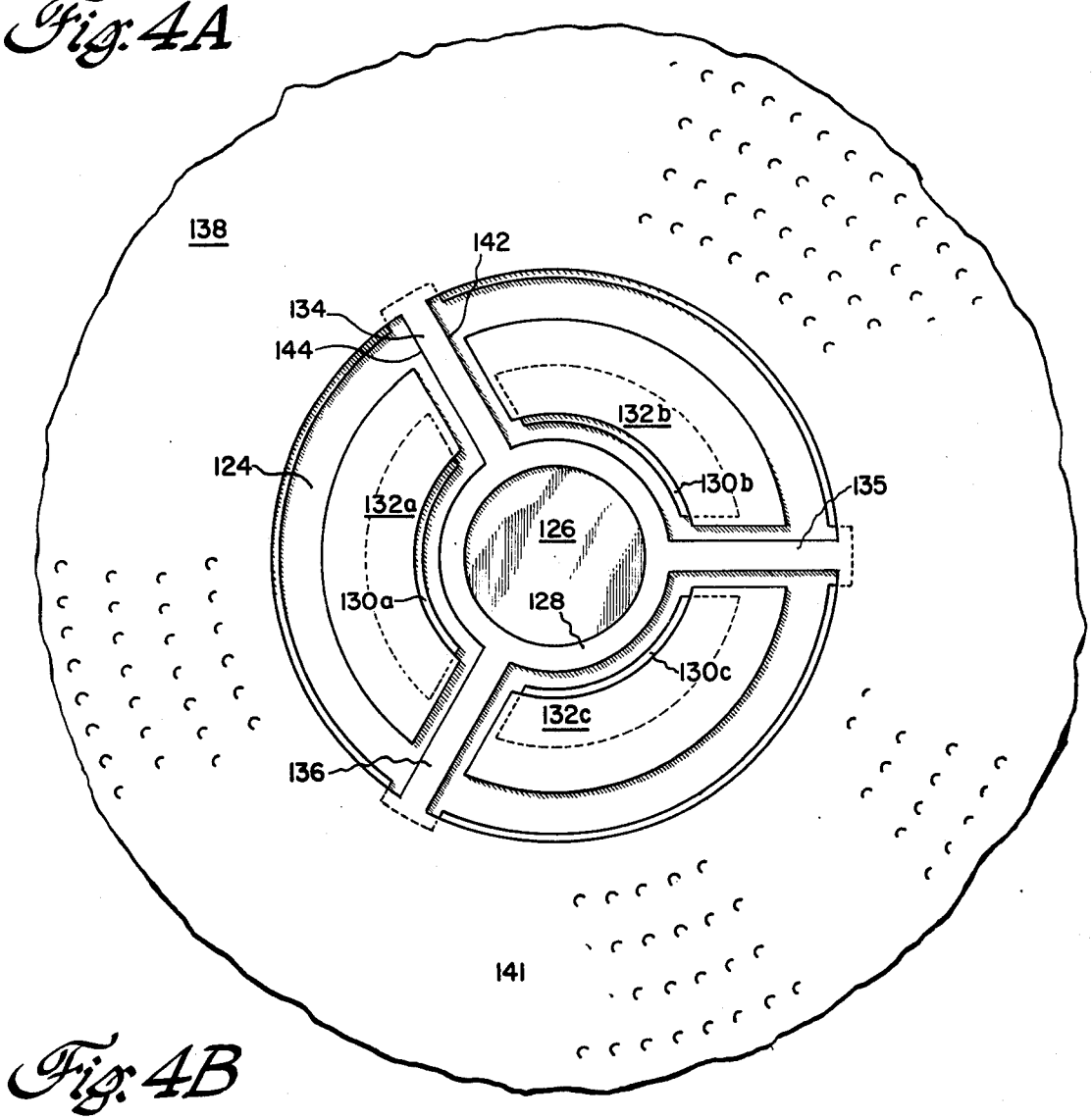
FIG. 4 illustrates a light triggered center gated thyristor structure in accordance with antother aspect of this invention.
Figure 4B:
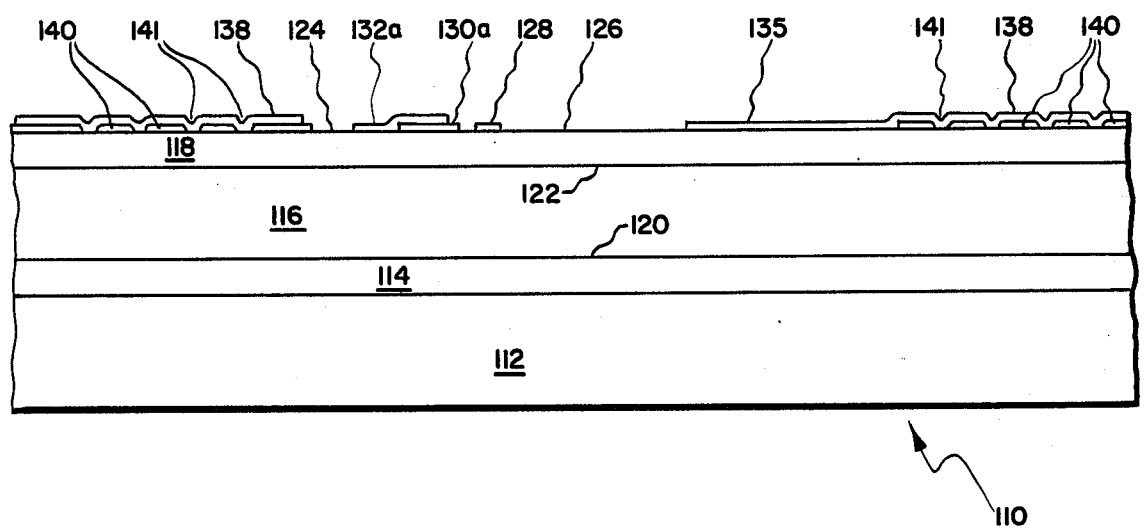

A light triggered thyristor device having a resistive shunt between the gate region and the cathode of the device constructed wholly on a semiconductor wafer is illustrated at FIG. 4. Thyristor 110 includes anode electrode 112, p-conductivity type semiconductor layer 114, n-conductivity type semiconductor layer 116, p-conductivity type semiconductor layer 118, first semiconductor junction 120 between p-type layer 114 and n-type layer 116, and second semiconductor junction 122 between n-type conductivity layer 116 and p-type layer 118. The arrangement of thyristor 110 is similar to that of the thyristor illustrated in FIG. 3 except for the specific arrangement of the uppermost semiconductor layers and electrodes. Surface 124 of semiconductor layer 118 includes light sensitive region 126 thereon which is substantially surrounded by electrode 128. Light sensitive region 126 may be polished or otherwise treated as has been hereinabove described. Segmented semiconductor layer 130 surrounds light sensitive gate region 126 and comprises semiconductor regions 130a, 130b and 130c. Electrode 132 which is also segmented and comprises segments 132a, 132b and 132c overlie semiconductor segments 130a, b and c, respectively. Electrode 126 includes projections 134, 135 and 136 which extend from electrode 126 to cathode electrode 138. Cathode electrode 138 is of generally annular configuration and overlies semiconductor layer 140 of similar configuration which is the uppermost semiconductor layer of the device and is of opposite conductivity type from layer 118, in accordance with this aspect of this invention, and n-conductivity type semiconductor layer. Projections 134 through 136 are resistive metallizations which, combined in parallel, provide a resistive connection between electrode 126 and electrode 138. The cathode region of the device which includes electrode 138 and semiconductor layer 114 includes a plurality of emitter shorts exemplified by short 141 which extends through semiconductor layer 114 and contacts layer 118. Semiconductor layer 114 is configured at the three places where projections 134 through 136 joint metallization 138 so that turn-on will not occur in these areas. Semiconductor layer 114 is therefore cut back slightly. Turn-on of the device occurs therefore only in the areas radially adjacent to the three segments of the pilot thyristor including electrodes 132 a, b and c. A relatively small amount of turn-on area is sacrificed.

While the device of FIG. 4 is illustrated as including resistive extensions 134 through 136, it will be understood by those skilled in the art that the techniques hereinabove described in conjunction with FIGS. 1–3 may readily be employed in conjunction with a device of the type illustrated in FIG. 4. For example, chip type resistors may be utilized at the three points of connection between electrodes 134 through 136 and electrode 126 as was hereinabove illustrated in conjunction with FIG. 2. Further, electrodes 134 through 136 may conveniently be broken so as to include a resistive layer of the type illustrated in FIGS. 1–3 as a portion of the electrodes. This is advantageous in providing a means for accurately trimming the resistance of the device. Where electrodes of the type illustrated in FIG. 4 are used, trimming may be accomplished by removing material from the edges of the extensions, as for example, edges 142 and 144 of electrode 134 thus narrowing the electrode and increasing the resistance thereof.

The amount of resistance required in any of the embodiments of this invention hereinabove described as illustrated in the several figures will be dependent upon the characteristics of the device. Typically, the variation in turn-on delay time of similar devices processed in different batches may be as high as 20 or 30% and therefore on the order of 50% of the current created by the light source utilized to trigger the device may be required to be shunted by the resistive portion of this invention. Further, in order to provide matched turn-on delay times (within approximately 0.5 microseconds) it is necessary to provide for adjustment of the resistance on the order of ± 20% in the manner as hereinabove described.

A light triggered thyristor in accordance with this invention provides, for the first time, a device suitable for fabrication by existing processes which, without the need for external components, is adjustable in order to accurately match the turn-on in delay time characteristics of other devices so that series or parallel operation of multiple devices is possible.

While the invention has been particularly shown and described with reference to several preferred embodiments thereof, it will be understood by those skilled in the art that various changes in form and detail may be made therein without departing from the true spirit and scope of the invention as described by the appended claims.

What is claimed is:

1. In a radiation triggered thyristor having an anode, a cathode and a radiation sensitive gate region, the improvement for providing adjustable turn-on time comprising:
    electrode means in said gate region surrounding at least a portion of said gate region and essentially isolated from said cathode region, said electrode means adapted to collect at least a portion of the current generated in said gate region by the incidence of radiation thereon; and
    adjustable resistor means connected between said electrode means and said cathode.
2. The radiation sensitive thyristor of claim 1 wherein said resisitor means comprises film resistor means.
3. The radiation sensitive thyristor of claim 1 wherein said resisitor means comprises a semiconductor layer in said thyristor.
4. The radiation sensitive thyristor of claim 1 wherein said resisitor means comprises, in combination:
    film resistor means; and
    semiconductor resistor means.
5. The radiation sensitive thyristor of claim 1 wherein said resistor means comprises a chip resistor.
6. The radiation sensitive thyristor of claim 5 wherein said resistance means further comprises a film resistor.
7. A light triggered thyristor having adjustable turn-on delay time comprising:
    a first semiconductor layer of a first conductivity type;
    a second semiconductor layer of a second conductivity type;
    a third semiconductor layer of a third conductivity type;
    a light sensitive gate region in said third semiconductor layer;
    first electrode means wholly on said third semiconductor layer and substantially surrounding said light sensitive gate region said first electrode means adapted to collect at least a portion of the current generated in said gate region by the incidence of light thereon;

a fourth semiconductor layer of said second conductivity type substantially surrounding said first electrode means and isolated therefrom;

second electrode means overlying said fourth semiconductor layer; and adjustable resistor means connected between said first and said second electrodes.

8. The light triggered thyristor of claim 7, wherein said resistor means comprises film resistor means.

9. The light triggered thyristor of claim 7, wherein said resistor means comprises a resistive semiconductor layer extending from a first surface of said third semiconductor layer down towards but not meeting said second semiconductor layer.

10. The light triggered thyristor of claim 7, wherein said resistor means comprises discrete integrally mounted resistor means.

11. The semiconductor device of claim 7, wherein said resistor means comprises, in combination:
film resistor means; and
semiconductor layer resistor means.

* * * * *